United States Patent
Mura et al.

(10) Patent No.: US 10,972,052 B2
(45) Date of Patent: Apr. 6, 2021

(54) METHOD AND APPARATUS FOR PROVIDING SELECTIVE PRE-SIGNAL AMPLIFIER, SUPPLY POWER CONDITIONING

(71) Applicant: Motorola Mobility LLC, Chicago, IL (US)

(72) Inventors: John Mura, Clarendon Hills, IL (US); Armin Klomsdorf, Chicago, IL (US); Jatin Kulkarni, Naperville, IL (US)

(73) Assignee: Motorola Mobility LLC, Chicago, IL (US)

( * ) Notice: Subject to any disclaimer, the term of this patent is extended or adjusted under 35 U.S.C. 154(b) by 85 days.

(21) Appl. No.: 16/277,912

(22) Filed: Feb. 15, 2019

(65) Prior Publication Data
US 2020/0266765 A1 Aug. 20, 2020

(51) Int. Cl.
*H03F 3/04* (2006.01)
*H03F 1/02* (2006.01)
*H02M 3/158* (2006.01)
*H04B 1/04* (2006.01)

(52) U.S. Cl.
CPC ........ *H03F 1/0227* (2013.01); *H02M 3/1582* (2013.01); *H04B 1/04* (2013.01); *H03F 1/0211* (2013.01); *H03F 1/0244* (2013.01); *H03F 2200/504* (2013.01); *H04B 2001/0408* (2013.01)

(58) Field of Classification Search
CPC ............. H03F 1/0227; H03F 2200/504; H03F 1/0244; H03F 1/0211; H02M 3/1582; H04B 1/04; H04B 2001/0408; H03G 3/3042; H03G 3/3036; H03G 3/001; H03G 3/004

USPC ......................................... 330/127, 279, 297
See application file for complete search history.

(56) References Cited

U.S. PATENT DOCUMENTS

| | | | |
|---|---|---|---|
| 8,519,788 B2* | 8/2013 | Khlat | H03F 1/0227 327/536 |
| 8,981,847 B2* | 3/2015 | Balteanu | H03F 1/02 330/136 |
| 2017/0223632 A1* | 8/2017 | Balteanu | H03F 3/211 |

OTHER PUBLICATIONS

Biranchinath Sahu et al., "A High-Efficiency Linear RF Power Amplifier With a Power-Tracking Dynamically Adaptive Buck-Boost Supply", IEEE Transactions on Microwave Theory and Techniques, vol. 52, No. 1, Jan. 2004, pp. 112-120.

(Continued)

*Primary Examiner* — Khanh V Nguyen
(74) *Attorney, Agent, or Firm* — Loppnow & Chapa

(57) ABSTRACT

The present application provides a pre-signal amplifier, supply power conditioning apparatus, a wireless communication device and a method for providing selective pre-signal amplifier, supply power conditioning. A selective voltage supply boost stage is included, which has an input coupled to a voltage supply source for receiving a voltage supply, and an output for producing a selectively boosted voltage supply source. A voltage boost circuit is further included having a voltage boost control input coupled to a modem for controlling when the selectively boosted voltage supply source produced at the output is boosted. When the voltage boost control input identifies at least one of one or more modes in which the modem is currently operating, that a boost to the received voltage supply is desired, the resulting selectively boosted voltage supply source produced at the output is boosted.

20 Claims, 6 Drawing Sheets

(56) References Cited

OTHER PUBLICATIONS

Jooseung Kim et al., "Envelope-Tracking Two-Stage Power Amplifier With Dual-Mode Supply Modulator for LTE Applications", IEEE Transactions on Microwave Theory and Techniques, vol. 61, No. 1, Jan. 2013, pp. 543-552.

* cited by examiner

METHOD AND APPARATUS FOR PROVIDING SELECTIVE PRE-SIGNAL AMPLIFIER, SUPPLY POWER CONDITIONING

FIELD OF THE APPLICATION

The present disclosure relates generally to conditioning the supply power provided to a power amplifier, and more particularly, to selectively boosting the supply power to the power amplifier dependent upon one or more detected conditions.

BACKGROUND

Wireless communication devices typically operate within an ecosystem that provides access to other users and sites for exchanging and/or accessing available information, engaging in commerce, as well as communicating with other users. While wireless communication devices are continuously integrating new and enhanced features, that leverage an ability to remotely transmit and receive data using wireless communication capabilities. The network environments within which they operate are also implementing new forms of access and/or communication to expand or improve the users' ability to interact with the network, as well as the network's ability to support the access interests of the users.

As features are added and/or enhanced, there often is a need to communicate wirelessly, an ever increasing amount of information/data in order to support the added and/or enhanced features of the network or device. This need for additional data throughput impacts both the overall operation of the network, as well as the data throughput relative to individual devices operating within the network.

The overall desire for higher data throughput for at least some cellular networks has led to at least some networks implementing support for additional operating modes, at least some of which can include compliance with new and/or updated operating standards, that can have new or updated operating requirements, such as new or additional frequency bands of operation, updated power requirements and/or the ability to more narrowly spatially target or differentiate the source or destination associated with an intended communication partner.

Examples of forms of communication being increasingly used in support of the new or updated modes of communication include Multiple Input Multiple Output (MIMO) forms of communication, including for example 4×4 MIMO relative to one or more bands of operation, carrier aggregation, and enhanced beamforming. MIMO is a method for expanding the capacity of a radio link using multiple transmit and receive antennas, where multipath propagation properties are used to distinguish between different sets of signaling sent simultaneously over the same radio channel via separate antennas. MIMO is distinct from other throughput enhancement techniques developed to augment the performance of a propagated data signal, such as a beamforming signal processing technique and/or a multiple antenna diversity scheme. Carrier aggregation allows a number of separate carriers to be combined into a single data channel to enhance the data rates and data throughput capacity relative to a particular user. Beamforming allows for the management of signal propagation characteristics relative to one or more transmitters and/or receivers to spatially manage the strength or coverage of a particular transmission relative to a particular direction, location or area.

At least some of the more recent implementations of various existing or developing standards including Long Term Evolution (LTE) type cellular networks and new radio access technology (NR) type cellular networks, have explored increasingly incorporating new or updated forms and/or modes of operation.

Once the new or updated forms of communications have been developed, the challenge then shifts to the manufacturers of the wireless communication equipment to implement the new or updated features while attempting to minimize the impact on previously present features, and other nearby users.

At least some enhancements have extended communications into new frequency bands of operation including some higher frequency bands. At least some of these enhancements have also involved higher transmission power requirements, which can exceed the upper limits associated with earlier requirements. However, enhancing a particular aspect of operation, such as transmission power, can create challenges relative to other aspects of operation, such as battery life. In some instances, components and/or circuits may be tuned to various forms or levels of operation, where extending the expected nature of operation might involve additional complexity and/or compromises to help limit the potential adverse effects to other aspects of operation.

The present innovators have recognized that the use of a selective voltage supply boost stage, which is controlled based upon one or more identified modes of operation can be used to facilitate selective support for increased radio frequency transmit power. The present innovators have further recognized that in some instances, such an inclusion can help to reduce the impact to other operating modes, that might not have a similar need for an increase in transmit power.

SUMMARY

The present application provides a pre-signal amplifier, supply power conditioning apparatus. The pre-signal amplifier, supply power conditioning apparatus includes a selective voltage supply boost stage, which has an input coupled to a voltage supply source for receiving a voltage supply, and an output for producing a selectively boosted voltage supply source. The selective voltage supply stage further includes a voltage boost circuit having a voltage boost control input coupled to a modem for controlling when the selectively boosted voltage supply source produced at the output is boosted. When the voltage boost control input identifies at least one of one or more modes in which the modem is currently operating, that a boost to the received voltage supply is desired, the resulting selectively boosted voltage supply source produced at the output is boosted.

In at least one embodiment, the output of the selective voltage supply boost stage is coupled to a supply voltage input of a power amplifier.

In at least a further embodiment, the selective voltage boost stage includes a comparator, which compares a voltage level value of the voltage supply received at the input to a voltage level threshold value. When the voltage level value of the voltage supply is below the voltage level threshold value, the voltage boost circuit of the selective voltage supply boost stage is controlled to boost the voltage supply received at the input for producing the selectively boosted voltage supply source, which is boosted to at least the voltage level threshold value, at the output.

The present application further provides a method in pre-signal amplifier supply power conditioning apparatus of a wireless communication device. The method includes receiving a voltage supply from a voltage supply source, and receiving a voltage boost control signal from a modem. A selectively boosted voltage supply source is produced at an output. The resulting selectively boosted voltage supply source produced at the output is boosted by a voltage boost circuit, when the voltage boost control signal received from the modem identifies at least one of one or more modes in which the modem is currently operating, that a boost to the received voltage supply is desired.

The present invention still further provides a wireless communication device, which has a pre-signal amplifier supply power conditioning circuit. The pre-signal amplifier supply power conditioning circuit includes a modem for producing a signal to be wirelessly communicated and a voltage boost control signal. The pre-signal amplifier supply power conditioning circuit further includes a selective voltage supply boost stage having an input coupled to a voltage supply source for receiving a voltage supply, and an output for producing a selectively boosted voltage supply source. The selective voltage supply boost stage further includes a voltage boost circuit having an input coupled to the voltage boost control signal of the modem for controlling when the selectively boosted voltage supply source produced at the output is boosted. When the voltage boost control signal at the input identifies at least one of one or more modes in which the modem is currently operating, that a boost to the received voltage supply is desired, the resulting selectively boosted voltage supply source produced at the output is boosted.

These and other features, and advantages of the present disclosure are evident from the following description of one or more preferred embodiments, with reference to the accompanying drawings.

DETAILED DESCRIPTION OF THE PREFERRED EMBODIMENT(S)

Figure 1:
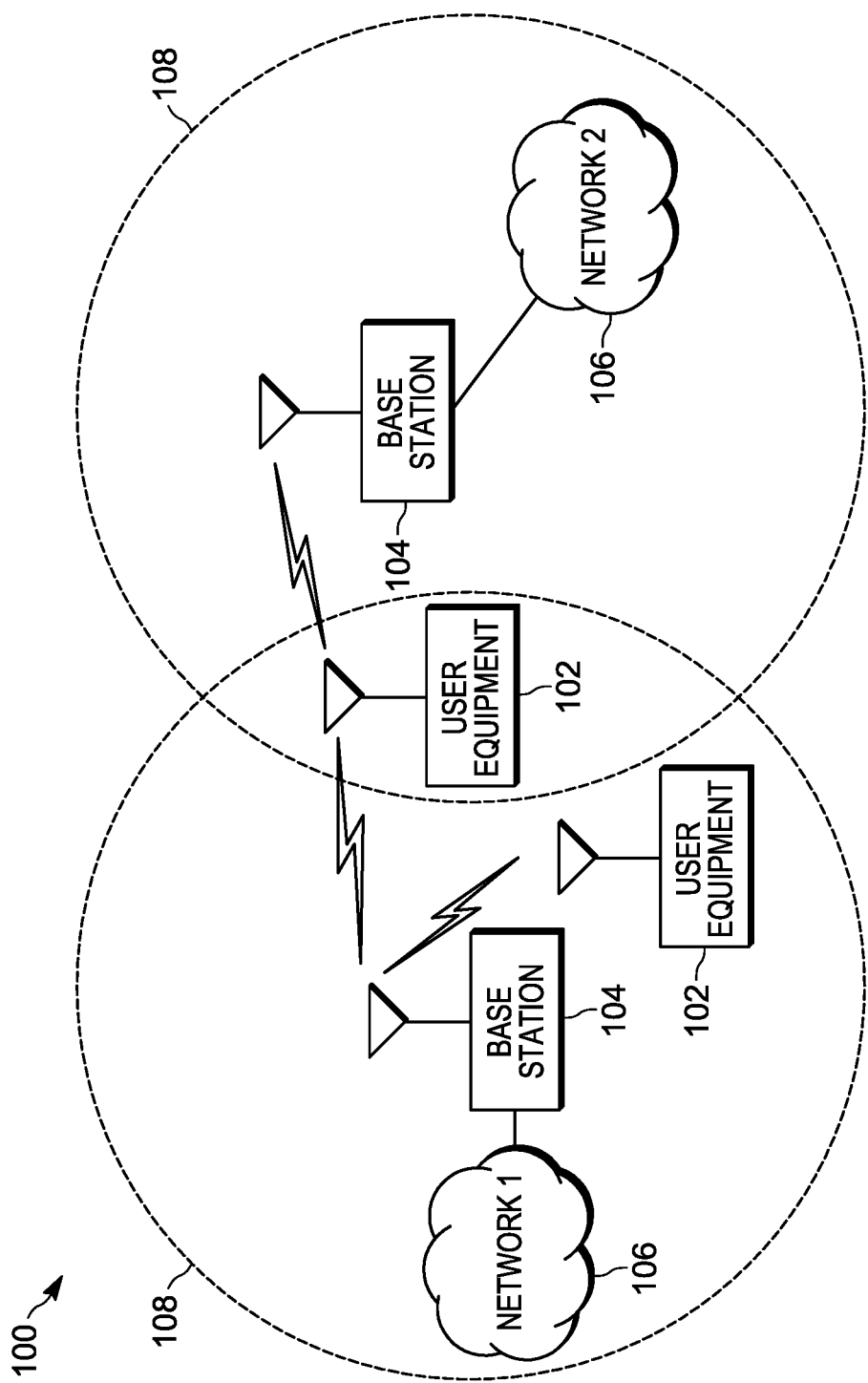
FIG. 1 is a block diagram of an exemplary network environment.

While the present invention is susceptible of embodiment in various forms, there is shown in the drawings and will hereinafter be described presently preferred embodiments with the understanding that the present disclosure is to be considered an exemplification and is not intended to limit the invention to the specific embodiments illustrated. One skilled in the art will hopefully appreciate that the elements in the drawings are illustrated for simplicity and clarity and have not necessarily been drawn to scale. For example, the dimensions of some of the elements in the drawings may be exaggerated relative to other elements with the intent to help improve understanding of the aspects of the embodiments being illustrated and described.

FIG. 1 illustrates a block diagram of an exemplary network environment 100. The exemplary network environment 100 can include one or more wireless communication devices, such as user equipment 102, which might communicate directly with one another, or via one or more networks, each having an associated network infrastructure. For example, the network infrastructure can include one or more base stations 104, which in turn are coupled to other network elements, which correspond to one or more networks, and which are generally represented as a clouds labeled network 106. The various base stations 104 can be associated with the same network or can be separately associated with different networks.

A base station 104 will generally have an expected associated area 108 of coverage, which defines the area over which wireless radio frequency signaling from the base station can generally reach. While the strength of wireless radio frequency signaling is generally affected by the range of transmission, within an expected area of coverage, terrain and/or other physical elements can impact the ability of the signaling to be perceived at particular locations within the expected area 108 of coverage. Depending upon the reception capabilities of the user equipment 102, the current signal strength of the signal being transmitted at a particular location will affect whether a particular user equipment 102 can send or receive data with a particular base station 104. As such, some networks 106 will make use of multiple geographically spaced apart base stations 104, to provide communication capabilities across a larger geographical area.

It is further possible that different base stations 104 can be more directly associated with different networks 106, which may interact with one another at different parts of the respective networks. The network(s) 106 can include any type of network that is capable of conveying signals between different associated elements of the network including the one or more user equipment 102.

In some instances, the user equipment 102 is generally a wireless communication device that could take the form of a radio frequency cellular telephone. However, the user equipment 102 could also take the form of other types of devices that could support wireless communication capabilities. For example, the different potential types of user equipment can include a tablet, a laptop computer, a desktop computer, a netbook, a cordless telephone, a selective call receiver, a gaming device, a personal digital assistant, as well as any other type of wireless communication device that might be used to support wireless forms of communication.

The various networks 106, base stations 104 and user equipment 102 could be associated with one or more different communication standards. A few examples of different communication standards that a particular network 106 could support include Global System for Mobile Communications (GSM) Code Division Multiple Access (CDMA), Orthogonal Frequency Division Multiple Access (OFDMA), Long Term Evolution (LTE), New Radio Access Technology (NR), Global Positioning System (GPS), Wi-Fi (IEEE 802.11), as well as various other communication standards. It is possible that each network and/or associated element could support one or more different communication standards. It is also possible that different networks 106 can support one or more of the same standards. In addition, wireless communication devices 102, base stations 104 and networks 106 may utilize a number of additional various forms of communication and communication techniques including beamforming, signal diversity, and simultaneous voice and data that concurrently enables the use of simultaneous signal propagation.

Figure 2:
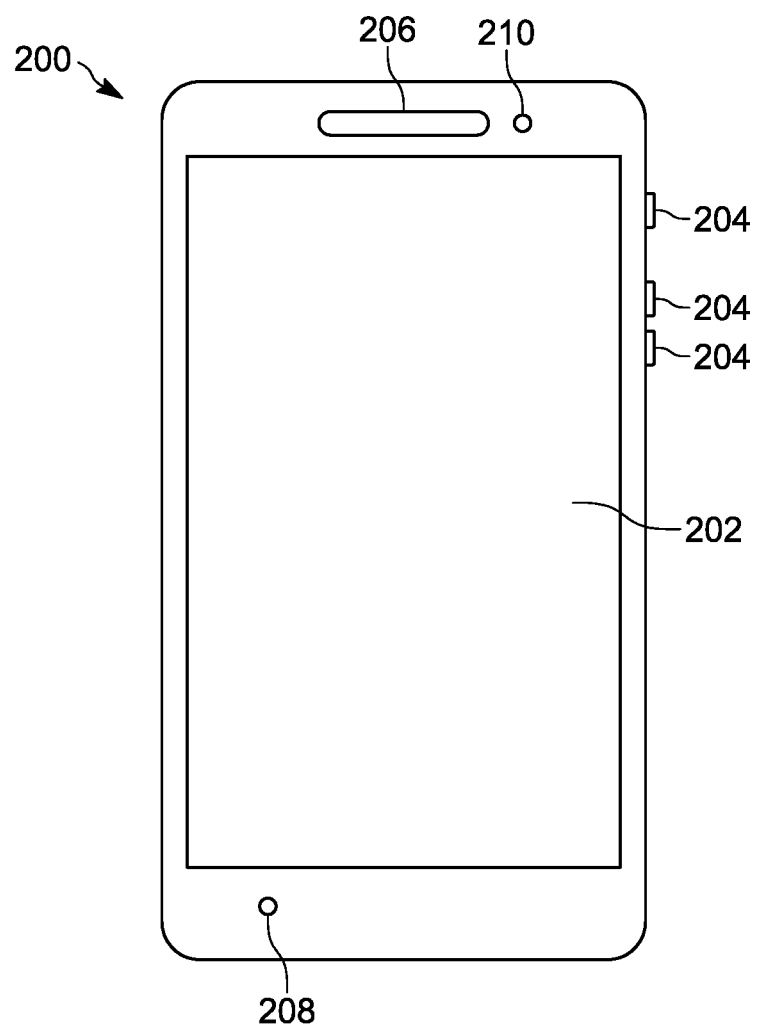
FIG. 2 is a front view of an exemplary user equipment in the form of a wireless communication device, such as a radio frequency radio telephone.

FIG. 2 illustrates a front view 200 of an exemplary user equipment 102 in the form of a wireless communication device, such as a radio frequency radio telephone. In the illustrated embodiment, the radio frequency cellular telephone includes a display 202 which covers a large portion of the front facing. In at least some instances, the display can incorporate a touch sensitive matrix, that can help facilitate the detection of one or more user inputs relative to at least some portions of the display, including an interaction with visual elements being presented to the user via the display 202. In some instances, the visual elements could include an object with which the user can interact. In other instances, the visual elements can form part of a visual representation of a keyboard including one or more virtual keys and/or one or more buttons with which the user can interact and/or select for a simulated actuation. In addition to one or more virtual user actuatable buttons or keys, the device can include one or more physical user actuatable buttons 204. In the particular embodiment illustrated, the device has three such buttons located along the right side of the device.

The exemplary electronic device, illustrated in FIG. 2, additionally includes a speaker 206 and a microphone 208 in support of voice communications. The speaker 206 may additionally support the reproduction of an audio signal, which could be a stand-alone signal, such as for use in the playing of music, or can be part of a multimedia presentation, such as for use in the playing of a movie, which might have at least an audio as well as a visual component. The speaker 206 may also include the capability to also produce a vibratory effect. However, in some instances, the purposeful production of vibrational effects may be associated with a separate element, not shown, which is internal to the device. Generally, the speaker 206 is located toward the top of the device, which corresponds to an orientation consistent with the respective portion of the device facing in an upward direction during usage in support of a voice communication. In such an instance, the speaker 206 might be intended to align with the ear of the user, and the microphone 208 might be intended to align with the mouth of the user. Also located near the top of the device, in the illustrated embodiment, is a front facing camera 210. The wireless communication device will also generally include one or more radio frequency transceivers, as well as associated transmit and receive circuitry, including one or more antennas that may be positioned internally relative to the device. In some instances, some or all of the antenna elements may also and/or alternatively be incorporated as part of the housing of the device.

Figure 3:
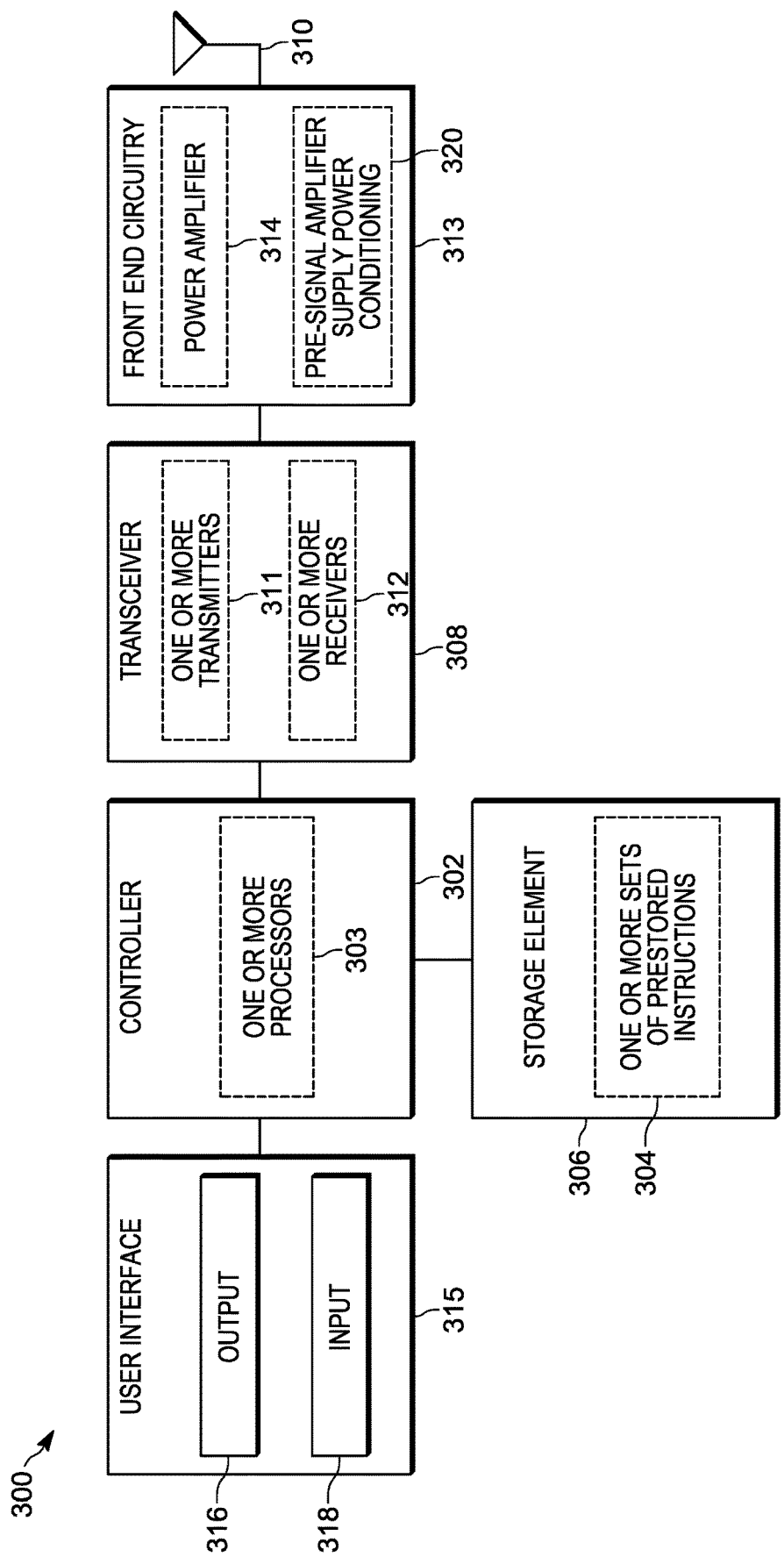
FIG. 3 is a block diagram of an exemplary wireless communication device.

FIG. 3 illustrates a block diagram 300 of an exemplary wireless communication device, in accordance with at least one embodiment. In the illustrated embodiment, the wireless communication device includes a controller 302, which is adapted for managing at least some of the operation of the device. In some embodiments, the controller 302 could be implemented in the form of one or more processors 303, which are adapted to execute one or more sets of pre-stored instructions 304, which may be used to form or implement the operation of at least part of one or more controller modules including those used to manage wireless communication and/or the coupling of wireless communication signals to one or more antennas. The one or more sets of pre-stored instructions 304 may be stored in a storage element 306, which while shown as being separate from and coupled to the controller 302, may additionally or alternatively include some data storage capability for storing at least some of the prestored instructions for use with the controller 302, that is integrated as part of the controller 302.

The storage element 306 could include one or more forms of volatile and/or non-volatile memory, including conventional ROM, EPROM, RAM, or EEPROM. The possible additional data storage capabilities may also include one or more forms of auxiliary storage, which is either fixed or removable, such as a hard drive, a floppy drive, or a memory card or stick. One skilled in the art will still further appreciate that still other further forms of storage elements could be used without departing from the teachings of the present disclosure. In the same or other instances, the controller 302 may additionally or alternatively incorporate state machines and/or logic circuitry, which can be used to implement at least partially, some of the modules and/or functionality associated with the controller 302.

In the illustrated embodiment, the device further includes a transceiver 308, which is coupled to the controller 302 and which serves to manage the external communication of data including their wireless communication using one or more forms of communications. In such an instance, the transceiver 308 will generally be coupled to one or more antennas 310, via which the wireless communication signals will be radiated and received. For example, the transceiver 308 might include one or more transmitters 311 and/or one or more receivers 312 for supporting wireless communications with various networks. Transceivers, receivers and/or transmitters for other forms of communication are additionally and/or alternatively possible. In the present instance, the transceiver 308 is coupled to the one or more antennas 310 via front end circuitry 313, which can help to facilitate the transceiver 308 interacting with the one or more antennas 310.

More specifically, the front end circuitry 313 is intended to allow one or more transceiver ports to be selectively coupled to one or more ports associated with the various antenna elements. In at least the illustrated embodiment, the front end circuitry 313 includes a power amplifier 314, which manages the power level of the signal being applied to the antenna. However, in some instances the degree to which the power amplifier 314 can boost a signal is dependent upon the source of power being supplied to the power amplifier 314. Correspondingly, the front end circuitry 313 of the present illustrated embodiment further includes a pre-signal amplifier supply power conditioning circuit 320, which can be used to selectively condition the power being supplied to the power amplifier 314. While a power amplifier 314 and a pre-signal amplifier supply power conditioning circuit 320 is expressly discussed, herein, front end circuitry can often have other components, like filters, diplexers, duplexers and switches, which help to facilitate the coupling of a produced signal to an antenna. The front end circuitry 313 can further include impedance matching elements, and/or additional signal amplifiers, so as to more effectively manage the conveyance of signals between the transceivers and the antenna elements.

In the illustrated embodiment, the device can additionally include user interface circuitry 315, some of which can be associated with producing an output 316 to be perceived by the user, and some of which can be associated with detecting an input 318 from the user. For example, the user interface circuitry 315 can include a display 202 adapted for producing a visually perceptible output, which may further support a touch sensitive array for receiving an input from the user. The user interface circuitry may also include a speaker 206 for producing an audio output, and a microphone 208 for receiving an audio input. The user interface output 315 could further include a vibrational element. The user interface input 318 could further include one or more user actuatable switches 204, one or more sensors, as well as one or more cameras 210. Still further alternative and additional forms of user interface elements may be possible.

Figure 4:
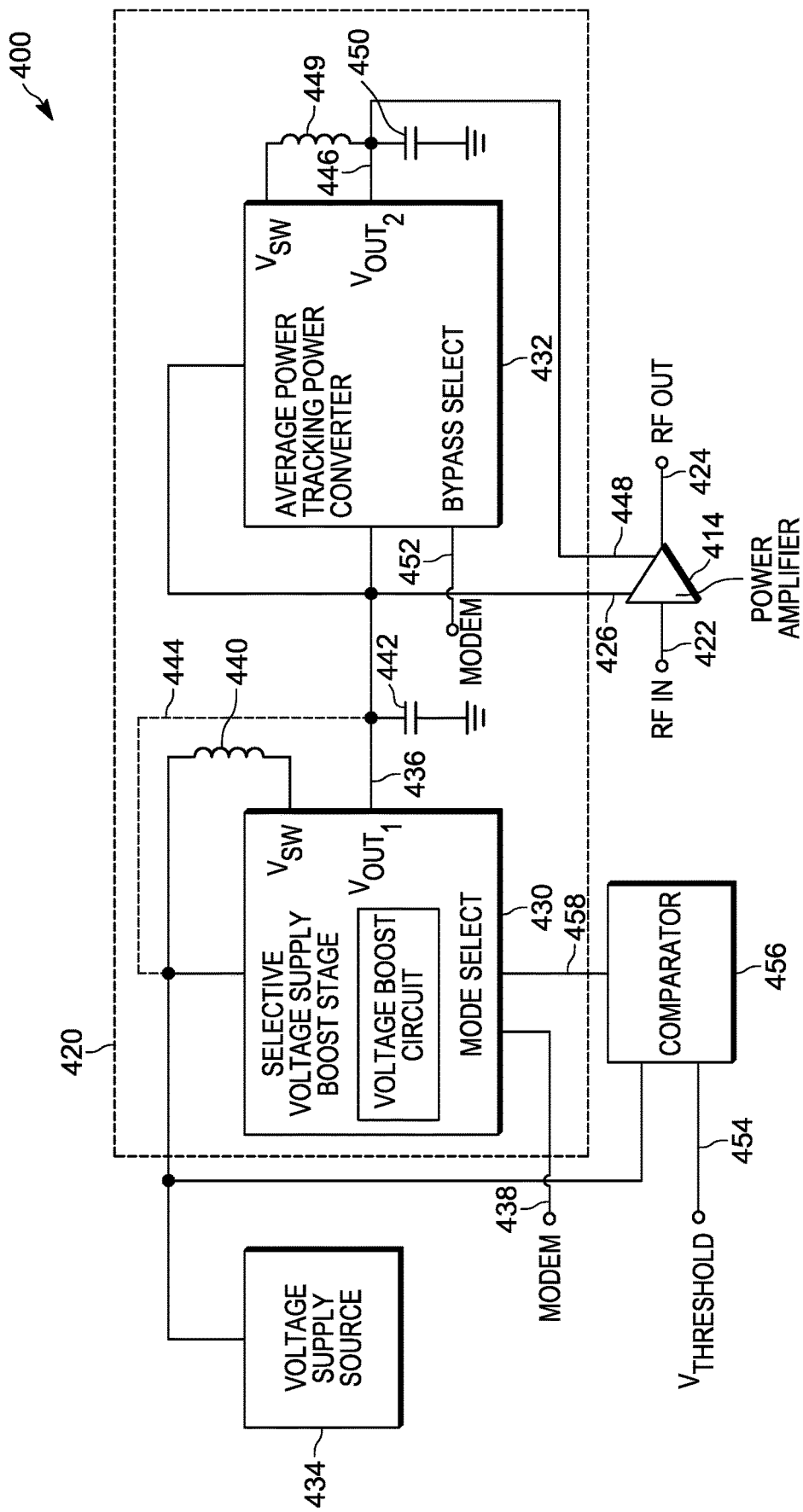
FIG. 4 is a partial block diagram of front end circuitry including a pre-signal amplifier, supply power conditioning circuit.

FIG. 4 illustrates a partial block diagram 400 of front end circuitry including a pre-signal amplifier, supply power conditioning circuit 420. More specifically, the partial block diagram 400 of front end circuitry includes a power amplifier 414, which has an input 422, which is adapted for receiving a radio frequency signal, and has an output 424, which is adapted for producing an amplified radio frequency signal. The power amplifier 414 further includes a supply voltage input 426 coupled to a pre-signal amplifier supply power conditioning circuit 420, for receiving an input supply voltage that is selectively pre-conditioned.

In the illustrated embodiment, the pre-signal amplifier supply power conditioning circuit 420 includes a selective voltage supply boost stage 430 and an average power tracking power converter stage 432. The selective voltage supply boost stage 430 receives an input voltage from a voltage supply source 434, such as a battery, and selectively produces a boosted voltage at an output 436. When not being selectively boosted, the voltage at the output 436 is similar to the input voltage received from the voltage supply source 434.

The selective boosting by the voltage supply boost stage 430 is controlled through the receipt of one or more mode select signals. At least one mode select signal 438 is received from a modem, which could be implemented as part of at least one of the one or more processors 303 of the controller 302. The mode select signal received from the modem could correspond to instances in which the modem is operating in a mode in which an enhanced signal level supported by a higher source voltage is desired. When active, the selective voltage supply boost stage could cause the voltage at the output 436 to be enhanced through a boosting of the voltage. A current repeatedly induced through an inductor 440 could produce a current, which when redirected to a path including a capacitor 442 could cause a voltage of a charge stored in the capacitor to exceed the original voltage level of the voltage supply source 434.

In at least some instances, the mode in which an enhanced signal level is desired could correspond to instances in which the transmitter is operating in a particular frequency band. Alternatively, the mode in which an enhanced signal level is desired could correspond to instances in which the mode is producing a signal to be transmitted for a particular wireless communication standard. Still further, the mode in which an enhanced signal level is desired could correspond to instances in which the transmitter is operating in a particular frequency band for a signal to be transmitted for a particular wireless communication standard.

In instances, where a wireless communication device is not operating in an environment where a desire for an enhanced signal level is expected, the selective voltage supply boost stage could be omitted from the circuit and a shunt 444 could be installed. In other words, the proposed solution for producing an enhanced supply voltage could be selectively included or excluded as part of the front end circuitry, as desired. The output of the selective voltage supply boost stage could then be used as an input for a second stage corresponding to an average power tracking power converter stage 432.

The average power tracking power converter stage 432, similarly includes a switching supply that can be used to step down and/or reduce as desired, the voltage being produced at the output 446, which then becomes another voltage input 448 of the power amplifier. The switching supply of the average power tracking power converter also makes use of an inductor 449 for producing a current, that can be selectively redirected for storage in a capacitor 450. In turn, the level of the voltage differential seen across the capacitor 450 can be managed as desired. A bypass select input 452 that can be received from the modem can be used to control the operation of the average power tracking power converter 432, where in some instances it may be desirable to selectively bypass the operation of the converter 432.

In addition to instances where operation within a particular mode may make it desirable to selectively boost the supply voltage, there are instances where a voltage level of the voltage supply source 434 may have a low power level, that would similarly benefit from being boosted. Such an instance could be detected by comparing the voltage level being produced by the voltage supply source 434 with a threshold voltage 454 using a comparator 456. The output 458 of the comparator 456 could be included as an additional mode select input of the selective voltage supply boost stage circuit 430.

By better managing the supply voltage, and limiting the boosting thereof to those instances where a higher supply voltage may be beneficial can help to better manage gain/power output of the power amplifier. In turn, this can serve to better manage the overall power efficiency, heat dissipation, bandwidth, and/or linearity of the device. This may also be used to better manage input/output impedance matching. While use of a switched mode power supply voltage converter is discussed in connection with the selective voltage supply boost stage circuit 430, one skilled in the art will readily recognize that other forms of voltage boosting circuits could be used without departing from the teachings of the present invention. In some cases involving a desired maximum output power, it may be desirable for the average power tracking power converter stage 432 to be generally bypassed, so as to eliminate the cascading of the two power converter efficiencies at maximum power, thereby improving efficiency. Still further, the inclusion of a selective voltage supply boost stage may help to avoid including a higher voltage battery in a device for accommodating limited use cases or modes having higher voltage level requirements.

Figure 5:
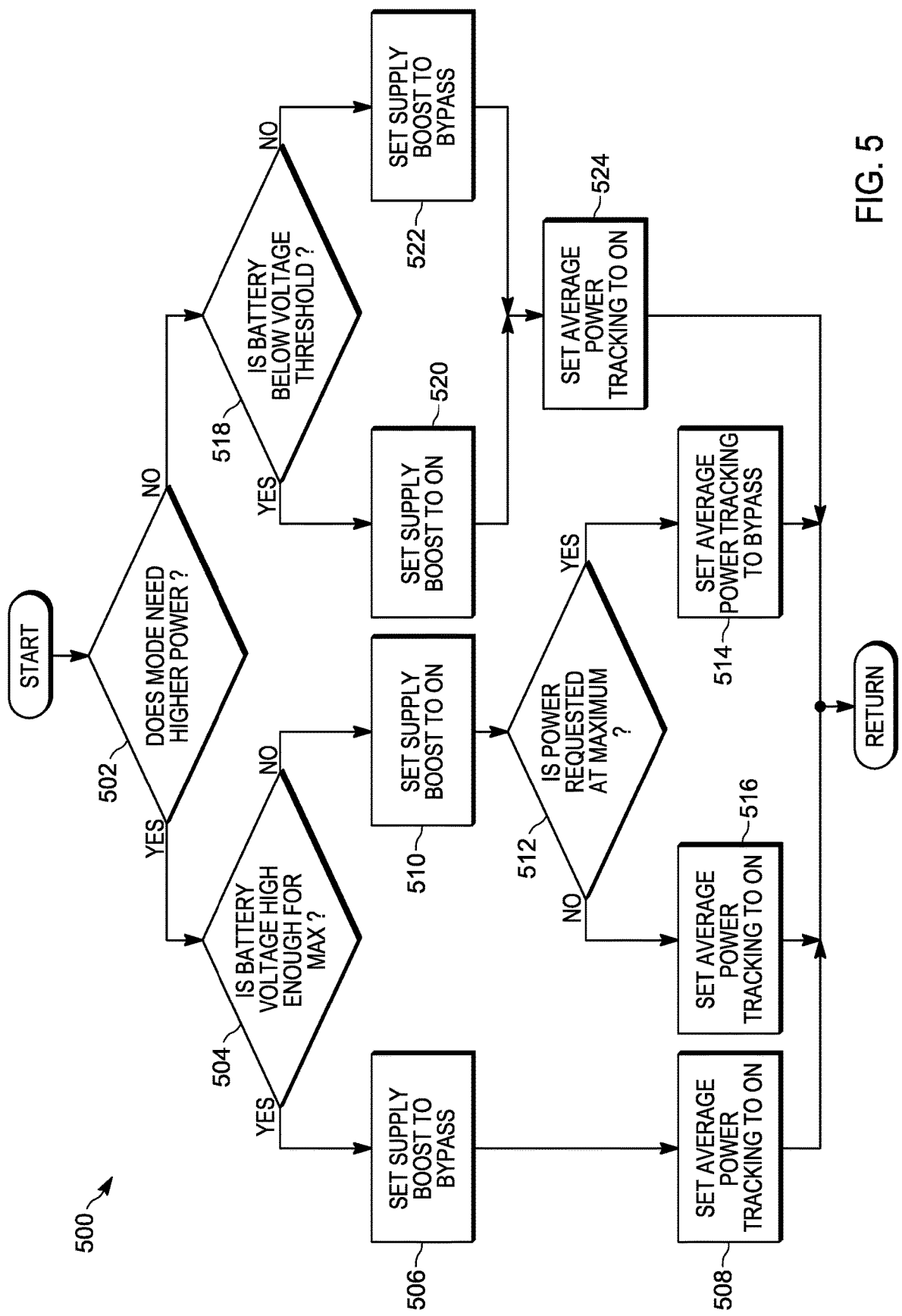
FIG. 5 is a flow diagram for managing the status of multiple power adjustment circuits in a selective pre-signal amplifier, supply power conditioning circuit.

FIG. 5 illustrates a flow diagram 500 for managing the status of multiple power adjustment circuits in a selective pre-signal amplifier, supply power conditioning circuit, where a first stage 430 can be used to provide a selective voltage supply boost, and the second stage 432 can reduce the supply voltage based upon a tracked determined average power. The flow diagram 500 can be used by the modem to determine the control signals to be supplied to each of the amplifier stages of the pre-signal amplifier supply power conditioning circuit 420.

Initially, a determination 502 is made as to whether the modem is operating in a mode where a higher voltage power level is needed and/or desired. Where the mode involves a requirement for a higher power level, a determination 504 is made as to whether the voltage level of the voltage supply source 434 (i.e. the battery) is high enough to support the maximum voltage requirements of the operating mode. Where the voltage level of the voltage supply source 434 is high enough to support the maximum voltage requirements of the operating mode, the first stage 430 is set 506 to bypass, and the second stage 432 is set 508 to activated or on. Where the voltage level of the voltage supply source 434 is not high enough to support the maximum voltage requirements of the operating mode, the first stage 430 is set 510 to on or boost, and a determination 512 is made regarding the maximum power requested relative to the boosted voltage level. Where the requested power is at the maximum of the boosted voltage level, the second stage 432 is set 514 to bypass. Where the requested power is not at the maximum of the boosted voltage level, second stage 432 is set 516 to activated or on.

Where the modem is not operating in a mode where a higher voltage power level is needed and/or desired, a determination 518 is made as to whether the voltage supply source 434 (i.e. battery) is below a predetermined voltage threshold 454. When the voltage level of the voltage supply source 434 is below the predetermined voltage threshold 454, then the first stage 430 is set 520 to on or boost. When the voltage level of the voltage supply source 434 is not below the predetermined voltage threshold 454, then the first stage 430 is set 522 to bypass. The second stage 432 is then set 524 to on. In this way the modem can determine the desired operating characteristics of each of the two stages of the pre-signal amplifier supply power conditioning circuit 320, so as to account for modes during which a higher power requirement is desired, as well as instances where the voltage level of the voltage supply source is low (i.e. brown out conditions).

Figure 6:
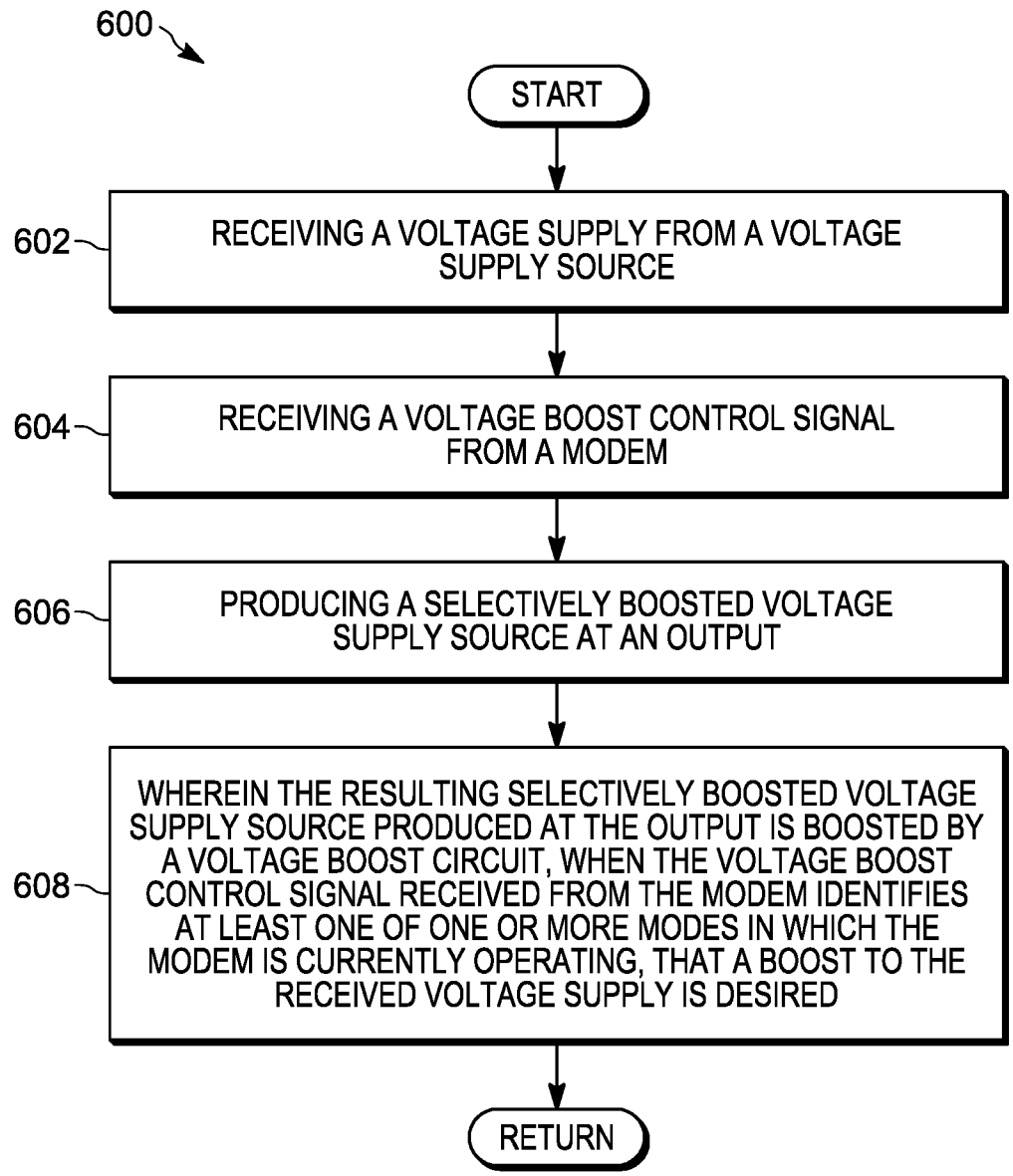
FIG. 6 is a flow diagram of a method for providing selective pre-signal amplifier, supply power conditioning.

FIG. 6 illustrates a flow diagram 600 of a method for providing selective pre-signal amplifier, supply power conditioning. The method 600 includes receiving 602 a voltage supply from a voltage supply source. A voltage boost control signal is then received 604 from a modem. A selectively boosted voltage supply source is produced 606 at an output, wherein 608 the resulting selectively boosted voltage supply source produced at the output is boosted by a voltage boost circuit, when the voltage boost control signal received from the modem identifies at least one of one or more modes in which the modem is currently operating, that a boost to the received voltage supply is desired.

While the preferred embodiments have been illustrated and described, it is to be understood that the invention is not so limited. Numerous modifications, changes, variations, substitutions and equivalents will occur to those skilled in the art without departing from the spirit and scope of the present invention as defined by the appended claims.

What is claimed is:

1. A pre-signal amplifier, supply power conditioning apparatus comprising:
a selective voltage supply boost stage having an input coupled to a voltage supply source for receiving a voltage supply, and an output for producing a selectively boosted voltage supply source;
wherein the selective voltage supply boost stage further includes a voltage boost circuit having a voltage boost control input coupled to a modem for controlling when the selectively boosted voltage supply source produced at the output is boosted, where when the voltage boost control input identifies at least one of one or more modes in which the modem is currently operating, that a boost to the received voltage supply is desired, the selectively boosted voltage supply source produced at the output is boosted.

2. The apparatus in accordance with claim 1, wherein the output of the selective voltage supply boost stage is coupled to a supply voltage input of a power amplifier.

3. The apparatus in accordance with claim 2, wherein the power amplifier has an input for receiving a radio frequency signal, and an output for producing an amplified radio frequency signal.

4. The apparatus in accordance with claim 3, wherein the amplified radio frequency signal is coupled to an antenna.

5. The apparatus in accordance with claim 2, wherein the output of the selective voltage supply boost stage is coupled to another voltage input of the power amplifier via an average power tracking power converter.

6. The apparatus in accordance with claim 5, wherein the average power tracking power converter is a switched mode power supply voltage converter.

7. The apparatus in accordance with claim 1, further comprising a comparator, which compares a voltage level value of the voltage supply received at the input to a voltage level threshold value, wherein when the voltage level value of the voltage supply is below the voltage level threshold value, the voltage boost circuit of the selective voltage supply boost stage is controlled to boost the voltage supply received at the input for producing the selectively boosted voltage supply source, which is boosted to at least the voltage level threshold value, at the output.

8. The apparatus in accordance with claim 1, wherein the selective voltage supply boost stage is adapted for selectively bypassing the voltage boost circuit of the selective voltage boost stage.

9. The apparatus in accordance with claim 1, wherein the voltage boost circuit of the selective voltage supply boost stage is a switched mode power supply voltage converter.

10. The apparatus in accordance with claim 1, wherein the voltage supply source is a battery.

11. The apparatus in accordance with claim 1, wherein the pre-signal amplifier is incorporated as part of a wireless communication device.

12. A method in pre-signal amplifier supply power conditioning apparatus of a wireless communication device, the method comprising:
receiving a voltage supply from a voltage supply source;
receiving a voltage boost control signal from a modem; and
producing a selectively boosted voltage supply source at an output; and
wherein the selectively boosted voltage supply source produced at the output is boosted by a voltage boost circuit, when the voltage boost control signal received from the modem identifies at least one of one or more modes in which the modem is currently operating, that a boost to the received voltage supply is desired.

13. The method in accordance with claim 12, wherein producing a selectively boosted voltage supply source at the output includes bypassing the voltage boost circuit, when a current operating mode identified by the voltage boost control signal is not one of the one or more operating modes of the modem, that the boost to the received voltage supply is desired.

14. The method in accordance with claim 12, wherein the selectively boosted voltage supply source that is produced is coupled to the supply voltage input of a power amplifier.

15. The method in accordance with claim 14, wherein the selectively boosted voltage supply source that is produced is coupled to another voltage input of the power amplifier via an average power tracking power converter.

16. The method in accordance with claim 15, wherein the average power tracking power converter is placed in a bypass mode, when a current operating mode of the modem identified by the voltage boost control signal corresponds to a maximum power mode, which can be satisfied through the selectively boosted voltage supply source being produced at the output being boosted.

17. The method in accordance with claim 12, wherein the selectively boosted voltage supply source produced at the output is also boosted, when the voltage level value of the voltage supply received from the voltage supply source is determined to be below a predetermined voltage level threshold value.

18. The method in accordance with claim 17, wherein producing a selectively boosted voltage supply source at the output includes bypassing the voltage boost circuit, when a current operating mode identified by the voltage boost control signal is not one of the one or more operating modes of the modem, that the boost to the received voltage supply is desired, and when the voltage level value of the voltage supply received from the voltage supply source is determined to be at or above the predetermined voltage level threshold value.

19. The method in accordance with claim 12, wherein receiving the voltage supply from the voltage supply source includes receiving the voltage supply from a battery.

20. A wireless communication device including a pre-signal amplifier supply power conditioning circuit, the pre-signal amplifier supply power conditioning circuit comprising:
- a modem for producing a signal to be wirelessly communicated and a voltage boost control signal; and
- a selective voltage supply boost stage having an input coupled to a voltage supply source for receiving a voltage supply, and an output for producing a selectively boosted voltage supply source;
- wherein the selective voltage supply boost stage further includes a voltage boost circuit having an input coupled to the voltage boost control signal of the modem for controlling when the selectively boosted voltage supply source produced at the output is boosted, where when the voltage boost control signal at the input identifies at least one of one or more modes in which the modem is currently operating, that a boost to the received voltage supply is desired, the selectively boosted voltage supply source produced at the output is boosted.

* * * * *